United States Patent [19]

Krohn et al.

[11] Patent Number: 4,500,870
[45] Date of Patent: Feb. 19, 1985

[54] METHOD AND COMPONENTS FOR REMOTE READING OF UTILITY METERS

[75] Inventors: David A. Krohn, Hamden; Louis A. Buffone, Shelton; Edmond I. Vinarub, Cheshire, all of Conn.

[73] Assignee: Eotec Corporation, West Haven, Conn.

[21] Appl. No.: 306,901

[22] Filed: Sep. 29, 1981

[51] Int. Cl.³ .......................................... H03K 13/02
[52] U.S. Cl. ........................... 340/347 P; 250/231 SE
[58] Field of Search ................. 340/347 M, 347 P; 250/231 SE, 227, 236

[56] References Cited

U.S. PATENT DOCUMENTS

| | | | |
|---|---|---|---|
| 2,953,777 | 9/1960 | Gridley | 340/347 |
| 2,989,642 | 6/1961 | Svec | 250/216 |
| 3,879,136 | 4/1975 | Takeda | 250/231 SE X |
| 4,037,219 | 7/1977 | Lewis | 340/204 |
| 4,101,882 | 7/1978 | Kramer | 340/347 P |
| 4,118,696 | 10/1978 | Warther | 340/347 M X |
| 4,162,399 | 7/1979 | Hudson | 250/231 SE |

FOREIGN PATENT DOCUMENTS 1376304  12/1974  United Kingdom ................ 250/227

OTHER PUBLICATIONS

Schwamb et al., Elements of Mechanism, John Wiley & Sons, 1904, pp.390–394.
Wait et al., Introduction to Operational Amplifier Theory . . . , 1975, McGraw-Hill Books, pp. 171–174; 281–286.

Primary Examiner—Thomas J. Sloyan
Attorney, Agent, or Firm—Darby & Darby

[57] ABSTRACT

A utility meter has a plurality of rotating shafts which have angular positions corresponding to the digits of a consumption reading. A cam is attached to that shaft which is associated with the least significant digit. The cam has a light reflecting track. Light from a light source is reflected off the track to a photodetector along an optical path which varies in length in accordance with angular cam position. Electronic circuitry is connected to the light source and photodetector and produces an output signal in digital form which has a frequency related to intensity of light incident upon the photodetector.

31 Claims, 10 Drawing Figures

METHOD AND COMPONENTS FOR REMOTE READING OF UTILITY METERS

The invention pertains to angular position sensors such as are used to monitor angular rotation of a part such as a shaft. More particularly, the invention pertains to angular position encoders which permit the angular rotation of a part to be electronically monitored at a place remote from the part itself. The invention also pertains to a system for use with meters such as utility meters that have a plurality of rotating shafts associated with dials, which shafts rotate in accordance with consumption of electrical or other energy. The system connects the utility meter to a computer which can monitor consumption automatically, eliminating the necessity of employing an individual to read the meter.

It is known in the art to provide an apparatus which can be installed on a utility meter to read the meter electronically. In U.S. Pat. No. 3,959,628, an apparatus is disclosed having pointer-carrying shafts cooperating with dials to indicate digits in a consumption reading, and each shaft is linked to a rotating disc. Each disc is divided into a plurality of machine-readable sectors. A motor-driven carriage which reads one disc at a time shuttles back and forth to read the discs, to register the rotational position of each disc encountered, and to send the information thus ascertained out of the meter in electronic form.

The apparatus disclosed in this reference has many moving parts and is therefore susceptible to malfunction. Furthermore, the apparatus is not well suited to retrofitting an existing utility meter at a consumption site. Additionally, if this apparatus is installed on a utility meter, problems will be encountered in synchronizing the information transmitted with the receiving unit used.

It is broadly an object of the invention to provide a system which would permit a meter such as a utility meter to be read electronically at a remote location and which would not be subject to the above-mentioned disadvantages.

One object of the invention is to provide an angular position sensor and encoder which can be easily installed on a shaft in, e.g., an existing utility meter at a consumption site.

Another object of the invention is to provide a device which will permit a meter such as a utility meter to be electronically read at a remote location over, e.g., an existing power line and which will be undisturbed by fluctuations in line frequency.

A still further object of the invention is to provide a device and a method for electronically reading a meter such as a utility meter at a remote location which has a minimum number of mechanical parts.

In accordance with the system aspect of the invention, it is not necessary to read all the digits on, e.g. a utility meter in order to accurately monitor consumption. Only the least significant digit of a power consumption reading is electronically monitored and transmitted to the utility company. The monitoring procedure occurs at a rate which is no less than the time required for that meter shaft which corresponds to the least significant digit to complete 360° of rotation. At the utility company, the least significant digit is stored. If a subsequent monitoring of the least significant digit indicates a smaller least significant digit, this reversal is recorded. The more significant digits are generated from the accumulated number of such reversals. Thus, the utility company has a current consumption reading which can be used for billing. Conveniently, a computer already in use at the utility company can be programmed to monitor all meters with sufficient regularity and to generate and store each complete meter reading.

Preferably, the system uses an angular position sensor which comprises a fixed light transmitter, a fixed light receiver, and a rotatable element such as a cam. The rotatable element has a light reflecting track which is fixed with respect to the element and moves with it. Light from the light transmitter is incident upon the light reflecting track, and is reflected to the light receiver.

As the element rotates, the light reflecting track moves towards and away from the transmitter. Thus, the length of the optical path from the transmitter to the light reflecting track to the light receiver is varied. This variation in optical path length varies light intensity incident upon the light receiver, and such variations in light intensity can be related directly to the angular position of the element. Light intensity at the light receiver is conveniently converted to an electrical signal by use of a photodetector, to provide the basis for the signal transmitted to the utility company.

BRIEF DESCRIPTION OF THE DRAWINGS

The drawings show a preferred but nonetheless merely illustrative embodiment of the invention in which.

DETAILED DESCRIPTION OF PREFERRED EMBODIMENTS

The preferred embodiment of the invention is shown and described in connection with a shaft in a watt-hour utility meter. However, it will be apparent that the invention can be used in connection with rotatable parts of any sort, and not merely shafts in, e.g., utility meters In the preferred embodiment, a signal representing the shaft position of a shaft is generated. The shaft in question is a shaft which is associated with a least significant digit of a consumption reading. Let it be assumed that at a consumption site in which the utility meter is installed, the register dial associated with the least significant digit of the consumption reading rotates once each day. As long as this apparatus is monitored at intervals of less than one day, it will be impossible for the consumer at the consumption site to be underbilled. For example, let it be assumed that the consumer has a 5-dial utility meter which reads 12345. 24 hours later, the consumption reading could be as much as 12355. If the apparatus were monitored by the computer at 24 hour intervals, the results might be equivocal, since a least significant digit of 5 could correspond to 12345 (an unchanged reading), or 12355 (a full 360° rotation). Thus, it is necessary to monitor angular position of the shaft at least once before the shaft completes a 360° rotation Then, if an initial reading is 5 and the next reading is 5, it is definitely known that no power has been consumed.

If this method is utilized, it might occur that on a subsequent monitoring of the meter, a least significant digit of 3 would be detected. This reversal, or detection of a lesser least significant digit, would indicate that the meter reading was actually 12353. If a least significant digit of 1 were detected still later, the meter reading would be 12361. Hence, the number of reversals can be totalled to generate the more significant digits in the consumption reading. A billing computer must already retain the most recent consumption reading, and must already be able to update this consumption reading to a subsequent consumption reading. Hence, some of the existing computer software can be retained.

As mentioned above, it is necessary to monitor the position of the rotating part. This is accomplished in the preferred embodiment by mounting a cam on a rotating shaft and using additional optical components to generate an electric signal, which can be processed by suitable circuitry and transmitted to, e.g., a remote computer, over, e.g., a power line. The cam and additional optical components will be described first, and the circuitry will be described next.

Figure 1A:
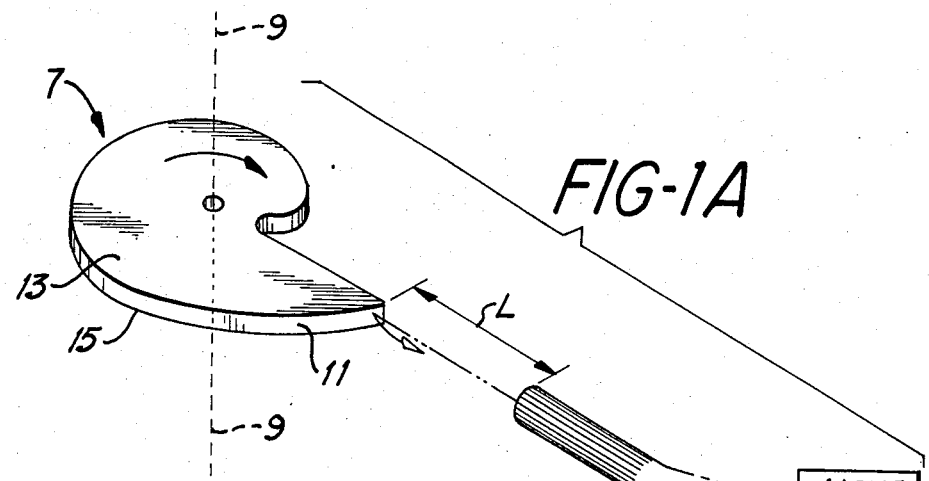
FIGS. 1A and 1B show a schematic representation of the optical components used in the invention.
Figure 1B:
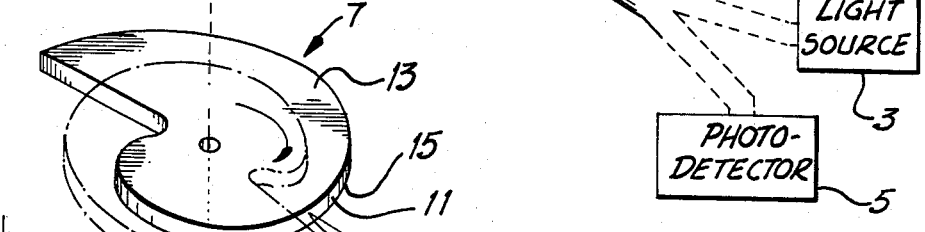

Turning to FIGS. 1A and 1B, a fiber optic bundle 1 is shown. Fiber optic bundle 1 is concentric and has a hollow cylindrical outer layer which contains 200 fibers which are 75 μm in diameter and have a 0.56 numerical aperture. The outer layer surrounds a single core fiber which is 400 μm in diameter and has a 0.3 numerical aperture.

The outer layer is connected to a light source 3, which is the preferred embodiment is an infrared source but which may be a light source of visible light. The core fiber is connected to a photodetector 5, which in the preferred embodiment is infrared sensitive but which may respond to visible light. The respective emission and response characteristics of light source 3 and photodetector 5 should in any event be matched.

Fiber optic bundle 1 is directed towards a cam generally indicated by reference numeral 7. Cam 7 is rotatable about an axis of rotation 9, which axis of rotation 9 is normal to cam 7. For illustrative purposes explained below, cam 7 is shown in different positions in FIGS. 1A and 1B.

In this example, cam 7 is a plate. Cam 7 has a helical circumferential surface 11 which forms a light reflecting track and is normal to the top and bottom surfaces 13 and 15 of cam 7 respectively. Preferably, circumferential surface 11 has a matte surface of, e.g., white paint, which serves as a diffuser.

Light from light source 3 is carried through the outer layer of fiber optic bundle 1 and is directed towards cam 7 normal to circumferential surface 11. As a result, light so directed reflects off circumferential surface 11 and back to fiber optic bundle 1, there to be incident upon the core fiber. Light so incident is carried back to photodetector 5. It will thus be apparent that fiber optic bundle 1 serves as a light transmitter which directs light from light source 3 onto circumferential surface 11 and which further acts as a light receiver, receiving light reflected off circumferential surface 11 and guiding it to photodetector 5.

Cam 7 is aligned with fiber optic bundle 1 such that regardless of the angular position of cam 7, fiber optic bundle 1 is always normal to circumferential surface 11. As a result, light from light source 3 will always be reflected back to photodetector 5. Because circumferential surface 11 act as a diffuser, small surface imperfections in circumferential surface 11 have little or no effect upon the reflection of light back to fiber optic bundle 1. However, as cam 7 rotates about axis 9, the optical path length between the end of fiber optic bundle 1 and circumferential surface 11 varies, because the point of incidence of light on circumferential surface 11 moves closer to and further from fiber optic bundle 1.

Light intensity is known to decrease with increasing distance between a light source and a light target in accordance with the inverse square law. When cam 7 rotates, there will be an angular position of cam 7 relative to fiber optic bundle 1 in which optical path length L is a minimum. In this position of cam 7 (see FIG. 1A) a maximum light intensity is incident upon photodetector 5. As cam 7 continues to rotate about axis 9 in the direction shown (see FIG. 1B) length L will increase, causing the intensity of light incident upon photodetector 5 to continue to decrease to a minimum value. (See the position shown in dotted lines in FIG. 1B.)

Thus, for any given intensity of light produced by light source 3, it is possible to establish a relationship between the angular position of cam 7 and the intensity of light incident on photodetector 5. This known relationship is used in order to enable the angular position of cam 7 (and any rotating part attached thereto) to be ascertained.

It is possible to use alternate structures in place of the configuration of optical components discussed above. For example, an individual light transmitter and light receiver can be substituted for the single unitary optical fiber bundle 1, and may have different orientations. It is likewise possible to use a non-concentric optical fiber bundle in which half the fibers are grouped together at light source 3 and the other half are grouped together at photodetector 5. Furthermore, it is possible to use a cam 7 which has a highly reflective circumferential surface 11. The matte finish here preferred reduces the costs of making cam 7, but is not absolutely necessary to the practice of the invention.

It is advantageous to make fiber optic bundle 1 as small as possible. If fiber optic bundle 1 has an excessive diameter, part of the light directed towards circumferential surface 11 will be reflected away from fiber optic bundle 1 because circumferential surface 11 is curved. As the diameter of fiber optic bundle 1 decreases, fiber optic bundle 1 can more accurately be regarded as a point transmitter and point receiver. As a result, the output of light source 3 can be reduced, as can the sensitivity of photodetector 5. Since the numerical aperture of the core fiber in fiber optic bundle 1 is less than the numerical aperture of the fibers in the outer layer in fiber optic bundle 1, the core fiber subtends a narrower area of view than is illuminated (on circumferential surface 11) by the fibers in the outer layer. This has the advantage that the light collected by reflection is more uniform.

Figure 2:
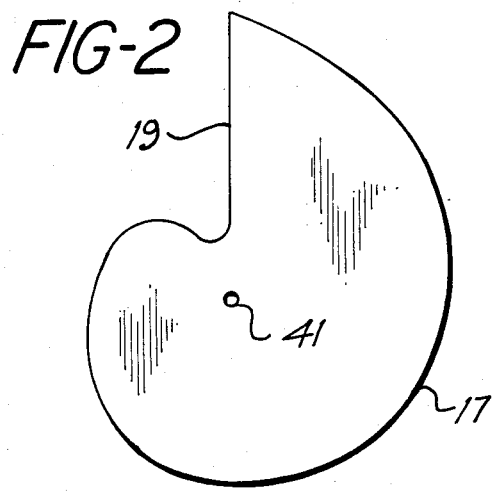
FIG. 2 shows a top view of a cam shown in FIGS. 1A and 1B.

As can best be seen in FIG. 2, circumferential surface 11 has a curved portion 17 and a radially outwardly extending straight portion 19. Ideally, fiber optic bundle 1 receives no light reflected off straight portion 19. As is clear from FIG. 2, circumferential surface 11 is helical, so that no two angularly displaced points on circumferential surface 11 are equidistant from the axis of rotation of cam 7, which axis passes through hole 41. Therefore, the intensity of light incident upon photodetector 5 is uniquely related to angular position of cam 7.

Figure 3:
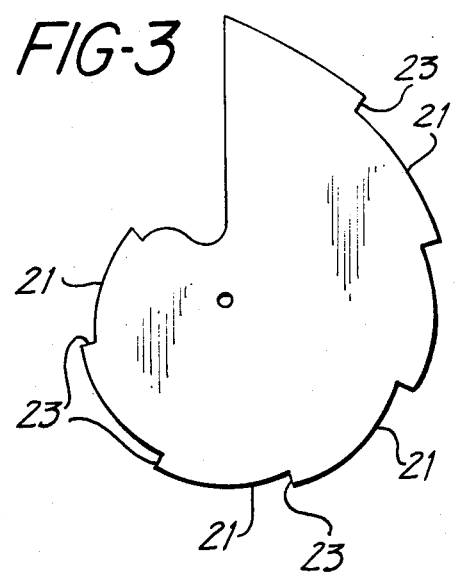
FIG. 3 shows a top view of an alternate construction of the cam.

It will be appreciated that changes in light intensity caused by rotation of cam 7 as shown in FIGS. 1A, 1B and 2 will be continuous since circumferential surface 11 is smooth. It is alternatively possible to manufacture cam 7 in a manner that the relationship between intensity and cam position has discrete steps. Such an alternative construction is shown in FIG. 3. In FIG. 3, circumferential surface 11 is divided into a plurality of steps 21, each step being an arc of a circle centered on hole 41 and being separated from adjacent steps by radially outwardly extending teeth 23. If, e.g., circumferential surface 11 is divided into ten steps 21, then within 36° segments of rotation of cam 7 the intensity of light reflected onto photodetector 5 will be constant.

Cam 7 need not have the light-reflecting track on its periphery. The light reflecting track can be located anywhere on cam 7, and can be, e.g. an inclined ramp located on its top or bottom surface, or on a circumferential ring of radially varying thickness.

Figure 4:
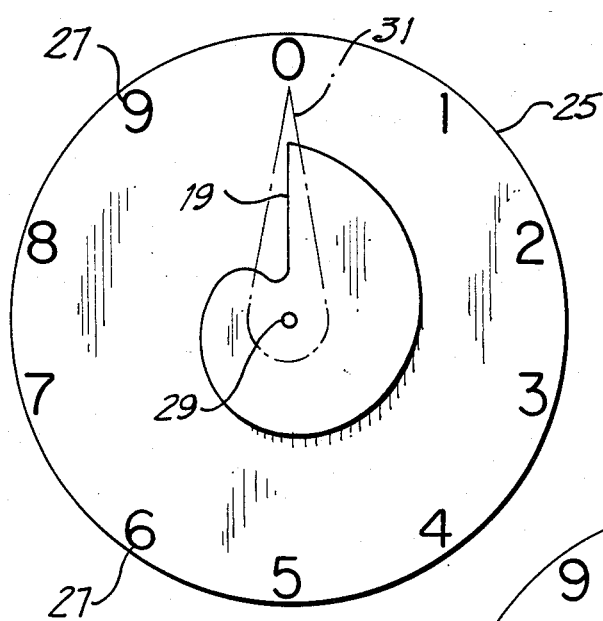
FIG. 4 shows a front view of a register dial in which the cam of FIGS. 1A and 1B is installed.

FIG. 4 shows how the cam 7 shown in FIGS. 1A, 1B, and 2 can be installed on a register dial 25. Register dial 25 has, e.g., numerals 27 distributed at regular intervals along a circle centered on a central shaft 29. Cam 7 is attached to shaft 29 (which passes through hole 41) and rotates together with shaft 29. In the construction shown in FIG. 4, cam 7 is smaller than the radius of the circle which includes numerals 27, so that numerals 27 are never covered by any part of cam 7. If desired, a pointer 31 may be installed on shaft 29 on top of cam 7, the tip of the pointer being aligned with the radially outermost end of straight portion 19 of circumferential surface 11.

Figure 5:
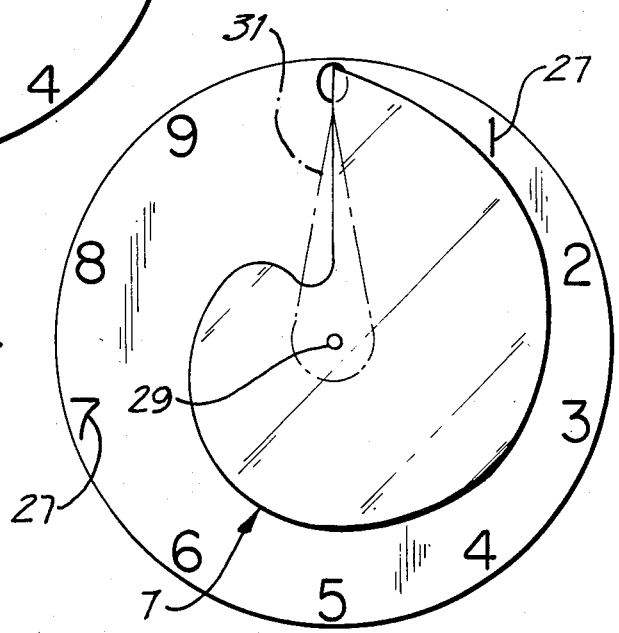
FIG. 5. shows a portion of a register dial in which another alternate construction of the cam is installed.

Alternatively, as is shown in FIG. 5, cam 7 may be larger. In this construction, cam 7 is made of a transparent material such as plastic, and its circumferential surface 11 is advantageously light-diffusing as before. As a result, it is possible to view numerals 27 even though they are totally or partly covered by cam 7 during rotation of shaft 29 and thus of cam 7.

Figure 6:
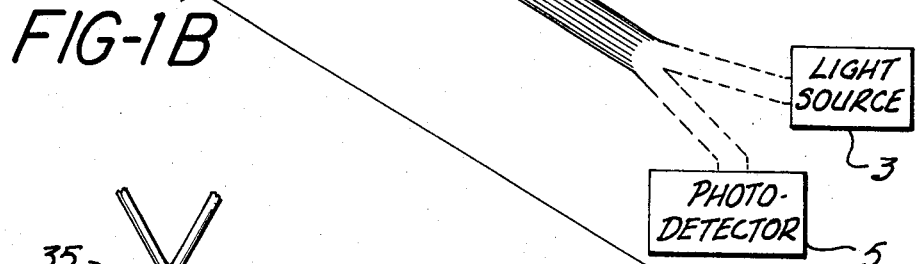
FIG. 6 shows all of the optical components shown in FIGS. 1A and 1B installed on a portion of a utility meter register.
Figure 6:
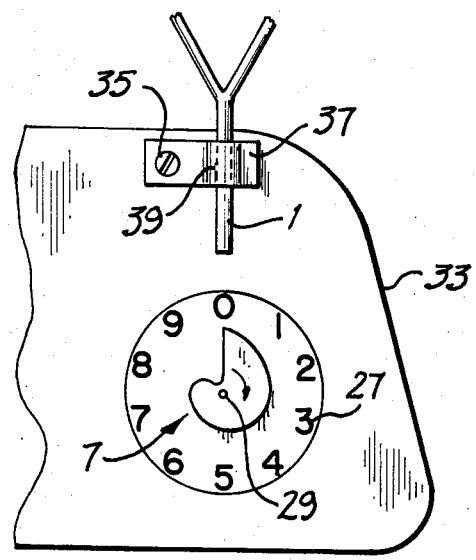

The optical components shown in FIGS. 1A, 1B, and 2 are shown installed in FIG. 6. Here, a register 33 of, e.g., a utility meter such as a watt-hour meter has, e.g., a screw 35 which supports the plate on which numerals 27 are marked. A block 37 is mounted to screw 35. Block 37 has a transversely extending channel 39 which receives fiber optic bundle 1. Fiber optic bundle 1 is perpendicular to shaft 29 and directs and receives light which passes directly over numeral 0. It can thus be seen that the apparatus shown in FIG. 6 can be used to monitor the angular position of shaft 29 while leaving numerals 27 visible for inspection by, e.g., an employee of a utility company.

The apparatus shown in FIG. 6 is associated with that register dial which is used to indicate the least significant digit of a consumption reading, such as a watt-hour consumption reading at a consumption site. Typically, such a watt-hour meter will have a plurality of such register dials. An employee is usually dispatched to read the meter and to record the current consumption reading. This reading is coded and fed to a computer, which computes the amount of power consumed from the last meter reading, bills the customer at the consumption site, and accordingly updates its records.

The preferred embodiment provides apparatus which can retrofit existing watt-hour meters and which can transmit consumption information over, e.g., existing power lines to a computer. The apparatus disclosed above can be conveniently retrofitted on an existing utility meter since it is only necessary to remove the pointer which is associated with the least significant digit of a consumption reading, to install the cam 7, fiber optic bundle 1 and block 37 and, if desired, to replace the pointer. In all cases, the cam 7 will be installed so that the straight portion 19 of the circumferential surface 11 is aligned with the previous pointer position.

An advantageous method of transmission is to use signals which are in digital form. In the preferred embodiment, this is accomplished by interrupting light from the light source 3 so that it operates at a constant frequency and has a square wave light output. In this preferred embodiment, the amplitude of the square wave output from light source 3 is modulated by cam 7 to produce an AM signal of constant frequency. This AM signal is then converted to an FM output signal in digital form which has a frequency varying linearly with the amplitude of the AM signal generated by photodetector 5.

In the preferred embodiment, the relationship between the angular position of the shaft in question, the voltage of the AM signal (after amplification in an input stage described below) and the frequency of the output signal in digital form is shown in Table I.

TABLE I

| Dial Digit | AM Signal Voltage | Digital Output Signal Frequency (Hz) |
|---|---|---|
| 0 | 1.0 | 10 |
| 1 | 0.9 | 9 |
| 2 | 0.8 | 8 |
| 3 | 0.7 | 7 |
| 4 | 0.6 | 6 |
| 5 | 0.5 | 5 |
| 6 | 0.4 | 4 |
| 7 | 0.3 | 3 |
| 8 | 0.2 | 2 |
| 9 | 0.1 | 1 |

This digital output signal is transmitted over an existing power line (not shown) or otherwise to a computer (not shown) which monitors the consumption readings of a plurality of users at various consumption sites.

In the preferred embodiment, it is necessary for the system to be accurate within 10%, so that a change of 36° in the angular position of the shaft can be interpreted as a change in the least significant digit of the consumption reading which is being monitored. However, in practice, the preferred embodiment is much more accurate and accuracy on the order of 3% to 4% has been achieved.

In the following description, a power source (not shown) provides both positive and negative DC voltages (here +5 V and ±15 V) to drive the circuitry herein described. Such voltage sources are conventional and the power source will not be further described. If the invention is used on a watt-hour meter, the power source may be connected to the incoming AC line or may be independently supplied as by batteries.

The preferred embodiment uses existing semiconductor chips. These chips have a plurality of pins to which components are connected. In the drawings, the pin numbers are enclosed by circles. As the description proceeds, reference will ocassionally be made to a specific pin on a chip. This reference refers to a pin, and not to an electronic component.

Figure 7:
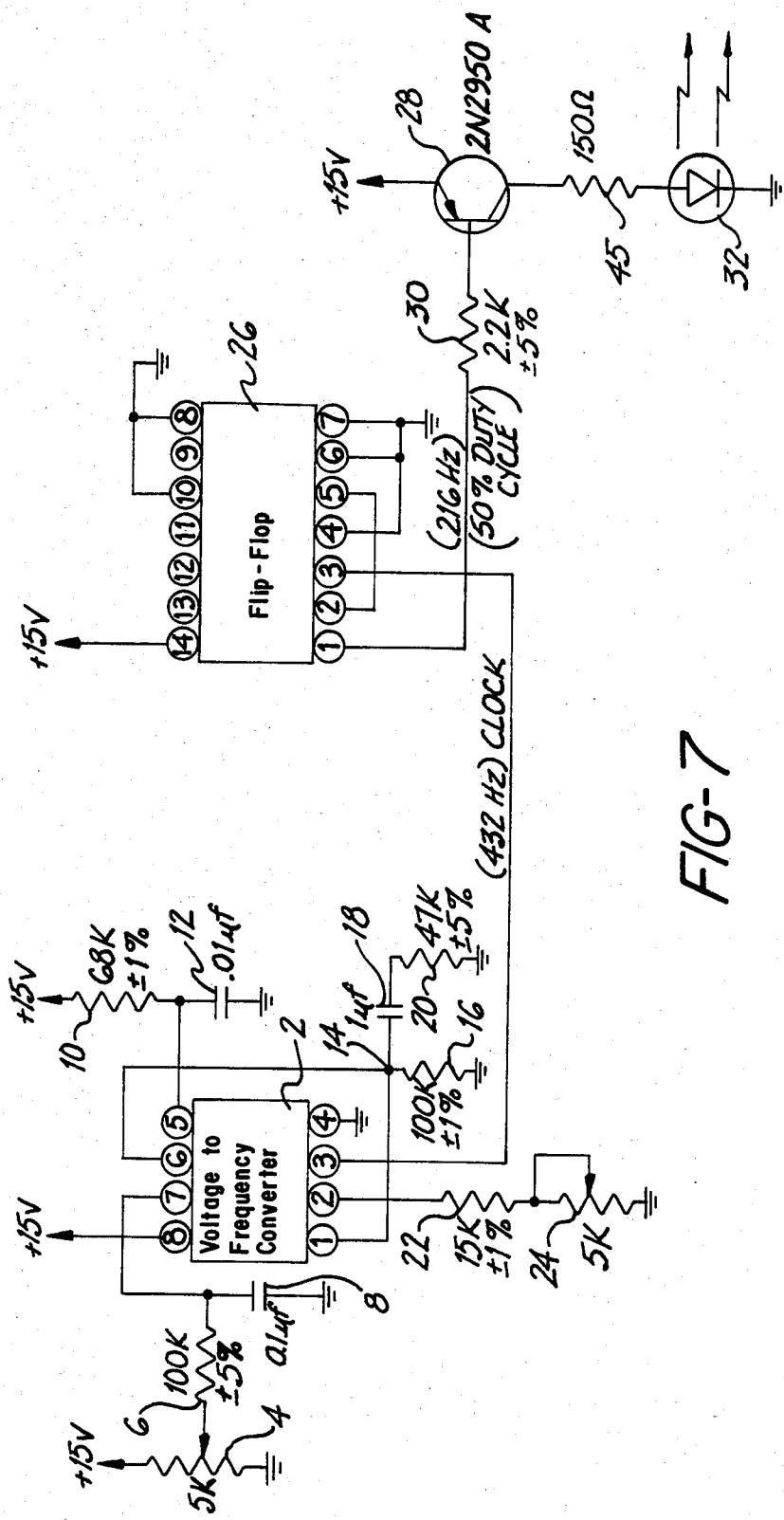
FIG. 7 is a schematic diagram of the circuitry used to drive the light source.

As mentioned above, light from the light source 3 is interrupted to produce a square-wave output. Circuitry which accomplishes this is shown in FIG. 7, but the same end result may be achieved by mechanically chopping the beam of light from light source 3 either before or after the light has passed through filter optic bundle 1. In FIG. 7, an 8-pin voltage-to-frequency converter chip 2 preferably of a type manufactured by National Semiconductor under the designation LM 331 produces a stable non-symmetrical clock signal at pin 3 as a linear function of an incoming voltage at pin 7, an RC time constant between the positive supply and pin 5, and a scaling factor represented by a resistance between pin 2 and ground. In this example, potentiometer 4 varies the incoming voltage and is connected between the positive supply and ground, and the tap of potentiometer 4 is connected to one end of resistor 6. Potentiometer 4 is used for calibration purposes described below. The other end of resistor 6 is connected to pin 7 of voltage-to-frequency converter 2 and is also connected to one plate of capacitor 8. The other end of capacitor 8 is grounded. Capacitor 8 serves as an AC bypass to prevent voltage fluctuation at pin 7.

Voltage-to-frequency converter 2 is supplied with power at pin 8 and is grounded at pin 4. Pin 8 is connected directly to the positive supply. Pin 5 is connected to the positive supply via resistor 10 and is also connected to ground via capacitor 12. Capacitor 12 and resistor 10 provide a base RC time constant, which, when scaled, determines the rate at which output frequency changes with input voltage.

Pins 1 and 6 of voltage-to-frequency converter 2 are tied together at circuit point 14. Circuit point 14 is connected to ground through resistor 16 and is also connected to one plate of capacitor 18. The other plate of capacitor 18 is connected to ground through resistor 20. Resistors 16 and 20 and capacitor 18 form a ripple filter. Pin 2 of voltage-to-frequency converter 2 is connected to one end of resistor 22. The other end of resistor 22 is connected both to the tap and one end of potentiometer 24. The other end of potentiometer 24 is grounded. Resistor 22 and potentiometer 24 provide the scaling factor mentioned above.

The circuitry described above is chosen such that a non-symmetrical 432 Hz signal will appear at pin 3 after potentiometers 4 and 24 have been properly adjusted. Such adjustment is carried out by first adjusting potentiometer 4 so that exactly 10 volts appears at its tap. Next, potentiometer 24 is adjusted so that an output signal of exactly 1000 Hz appears at pin 3. Next, potentiometer 4 is readjusted so that exactly 4.32 volts appears at its tap. This causes a 432 Hz signal to appear at pin 3.

In this example, a signal of 432 Hz is chosen because it is not evenly divisible by a standard line frequency of 60 Hz. This avoids fluctuation of the signal with changes in line frequency caused by coupling. Furthermore, the frequency chosen is convenient for use in the signal-processing circuitry described below, but the clock frequency can be changed to any other frequency which is evenly indivisible by 60. Furthermore, the voltage-to-frequency converter 2 and components associated therewith could be replaced by any other adjustable precision oscillator.

Pin 3 of voltage-to-frequency converter 2 is connected to pin 3 of a 14 pin toggle flipflop chip 26 which is preferably a type manufactured by RCA under the designation CD4013 AE. Power is supplied to toggle flipflop 26 by connection of pin 14 to the positive supply. Pins 10, 8, 7, 6, and 4 of toggle flipflop 26 are grounded and pins 2 and 5 are connected together.

As is well known, toggle flipflop 26 has an output (at pin 1) which changes its logical state each time an incoming pulse is received at its input (at pin 3). Thus, if the output at pin 1 of toggle flipflop 26 is logically low, the next incoming pulse at pin 3 will bring the output of toggle flipflop 26 logically high. A subsequent incoming pulse will bring the output of toggle flipflop 26 low once again. Hence, the output at pin 1 will be a 216 Hz square wave with a 50% duty cycle, i.e., will be a 216 Hz square wave in which the duration of each pulse will be equal to the duration of each interpulse gap.

The output square wave clock signal from toggle flipflop 26 is connected to the base of PNP transistor 28. The emitter of transistor 28 is connected to the positive supply, and the collector is connected to the anode of light-emitting diode 32 via resistor 45. The cathode of diode 32 is grounded. Diode 32 is an infrared light emitter preferably manufactured by Texas Instruments under the designation TIL-31, and is here used for the light source 3 described above. Infrared light is used in the preferred embodiment to eliminate interference caused by ambient light around the meter in which this apparatus is installed.

The 216 Hz clock signal at the base of transistor 28 turns transistor 28 on and off with the same frequency and duty cycle, so that square wave pulses of infrared light are emitted from diode 32 at a frequency of 216 Hz and at a duty cycle of 50%. It will be appreciated that the ultimate object of all the circuitry described above is to operate diode 32 to produce square wave pulses of light of a constant frequency. Any other suitable circuitry can be used to drive diode 32. The details of the foregoing circuitry form no part of the invention.

Figure 8A:
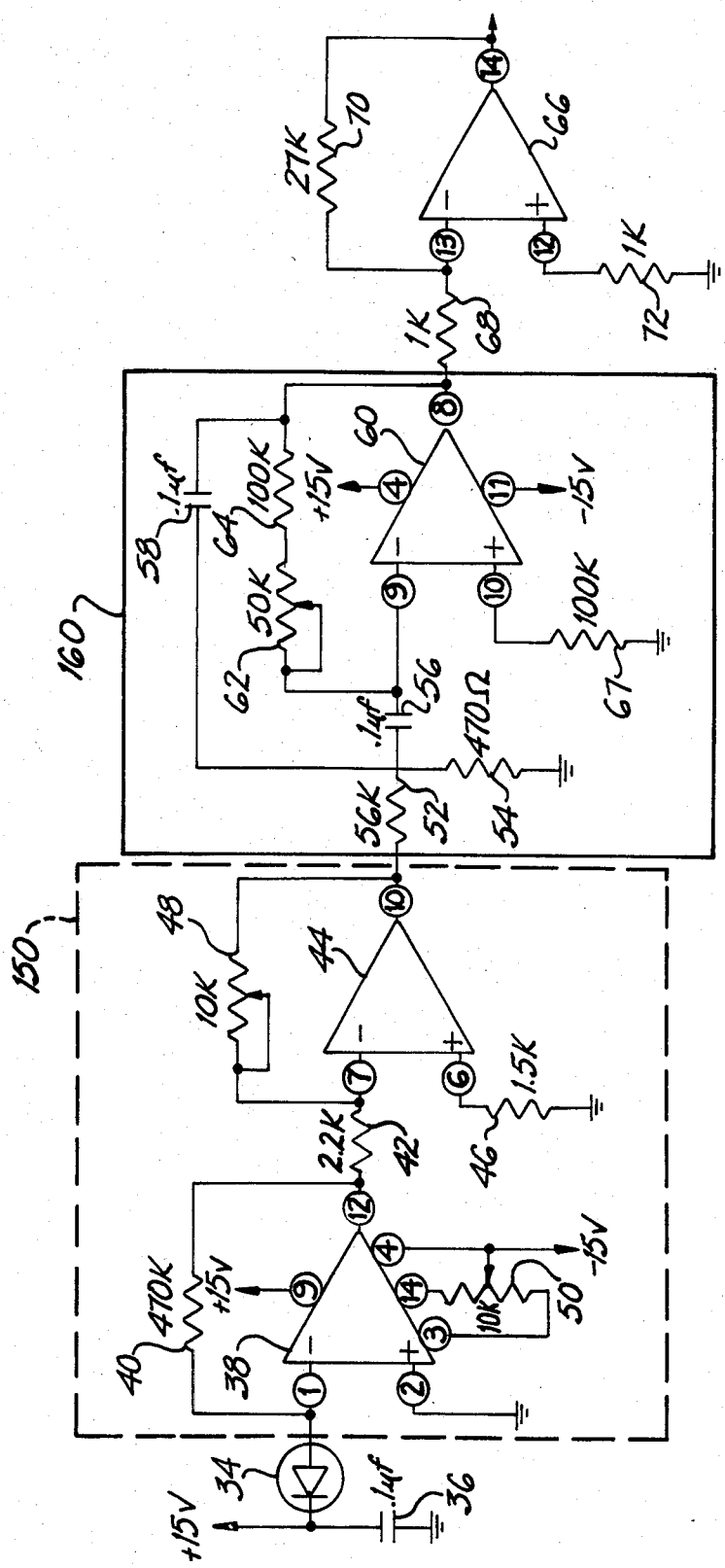
FIGS. 8A and 8B show the signal-processing circuitry which is connected to the photodetector.
Figure 8B:
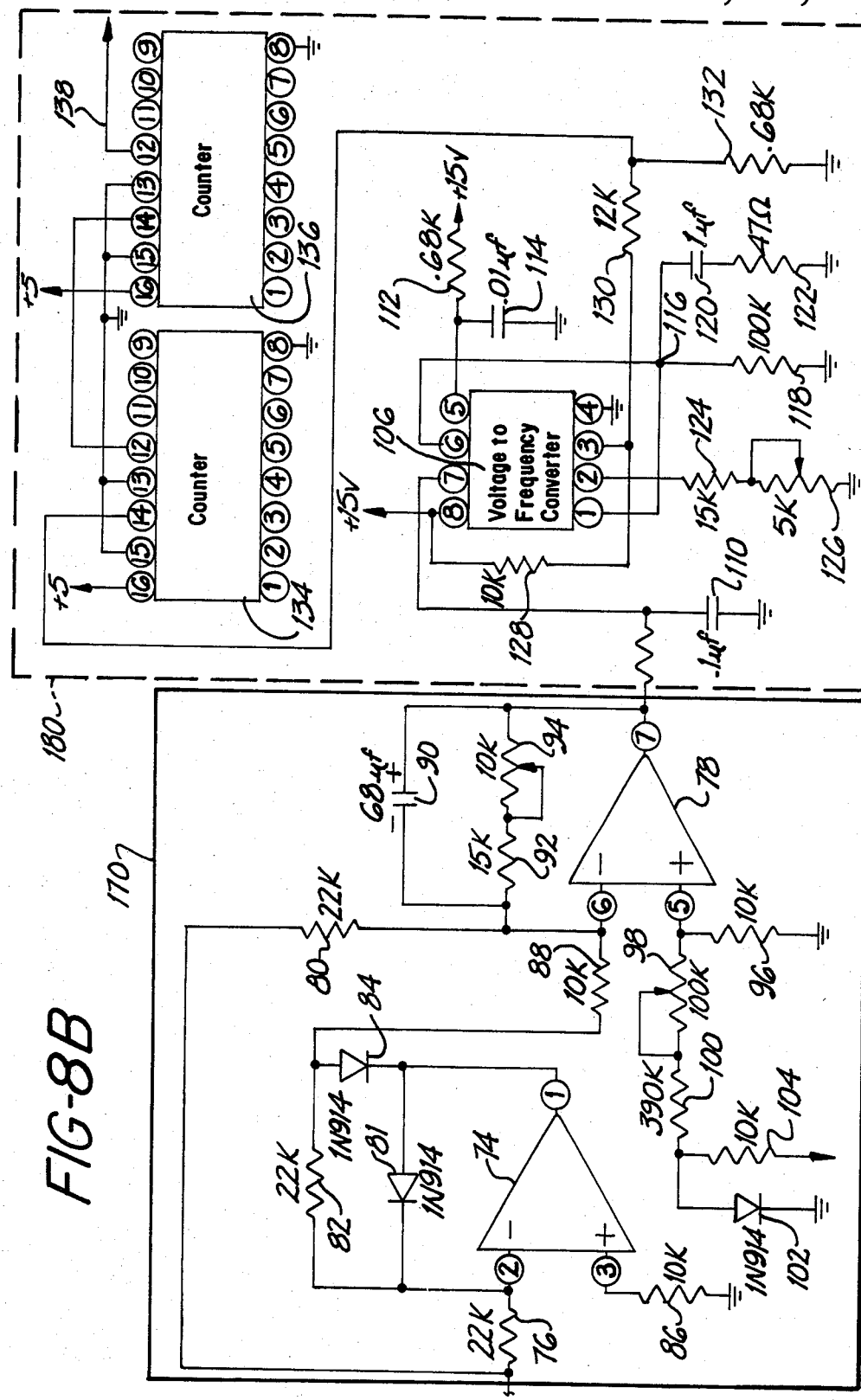

As mentioned above, the square wave output from diode 32 is modulated by cam 7 and made incident upon photodetector 5, to produce a modulated AM signal which is used to generate a digital FM signal that is sent to, e.g., a computer. The circuitry which accomplishes this is shown in FIGS. 8A and 8B. Briefly, the photodetector 5 is connected to an input stage 150 which amplifies the signal from photodetector 5 and produces the AM signal referred to in Table 1. This AM signal is then passed through a bandpass filter 160 and a buffer amplifier. Thereafter, the AM signal is rectified in a full-wave rectifier stage 170 to produce a DC signal. This DC signal drives an output stage 180 which produces a digital FM signal. The circuitry will be described in this order.

In this example, photodetector 5 is a photodiode 34 preferably manufactured by Telefunken under the designation BPW 24. The cathode of photodiode 34 is connected to the positive supply and, through an AC bypass capacitor 36, to ground. The anode of photodiode 34 is connected to the inverting input of an operational amplifier 38, which is at the front end of input stage 150. The non-inverting input of operational amplifier 38 is grounded. The output and inverting input of operational amplifier 38 are connected through resistor 40 to form a negative feedback loop.

The output of operational amplifier 38 is coupled to the inverting input of operational amplifier 44 via coupling resistor 42. The non-inverting input of operational amplifier 44 is coupled to ground through resistor 46. The output and inverting input of operational amplifier 44 are connected through potentiometer 48 in a negative feedback loop.

Operational amplifier 38 and 44 are preferably component parts of a single semiconductor chip manufactured by RCA under the designation CA3240 E1. Pins 9 and 4 are respectively connected to the positive and negative supplies to power the chip. Pins 3 and 14 are connected to opposite ends of potentiometer 50. The tap of potentiometer 50 is connected to the negative supply.

As a result of pulses of infrared radiation from diode 32 as modulated by the cam, a DC current of varying magnitude will flow through photodiode 34. This in turn will generate an AM signal at the output of operational amplifier 38, the carrier frequency of this AM signal being 216 Hz. This AM signal is then amplified in operational amplifier 44 and appears at the output thereof (i.e. the output of input stage 150) in amplified form. Potentiometer 50 is provided to adjust the offset of operational amplifier 38 in such a fashion that when photodiode 34 is covered up and no light impinges on it the voltage at the output of operational amplifier 44 will be 0. Potentiometer 48 adjusts the gain of operational amplifier 44. This gain adjustment will be described in more detail below.

The output of input stage 150 is then routed through the bandpass filter 160. The output of operational amplifier 44 is connected to one end of resistor 52. The other end of resistor 52 is connected to one end of resistor 54, one plate of capacitor 56, and one plate of capacitor 58. The other end of resistor 54 is connected to ground, the other plate of capacitor 56 is connected to the inverting input of operational amplifier 60, and the other plate of capacitor 58 is connected to the output of operational amplifier 60. Operational amplifier 60 is preferably one component of a single semiconductor chip manufactured by Texas Instruments under the designation TL064.

Two resistances are placed in series with each other between the inverting input and the output of operational amplifier 60. The inverting input is connected to one end and the tap of potentiometer 62, and the other end of potentiometer 62 is connected to one end of resistor 64. The other end of resistor 64 is connected to the output of operational amplifier 60. The entire semiconductor chip is suppled with power by connection of pins 4 and 11 to the positive and negative supplies respectively. The non-inverting input of operational amplifier 60 is coupled to ground by resistor 67.

Capacitors 56 and 58, potentiometer 62 and resistor 64 cooperatively form a network which is connected between the inverting input and the output of operational amplifier 60. The network has a maximum impedance at a particular frequency and has lower impedances at all other frequencies. Since capacitor 58 has a decreasing reactance with increasing frequency and is in a feedback loop between the output and inventing input of operational amplifier 60, capacitor 58 tends to cause operational amplifier 60 to act as an active low-pass filter. Since the voltage across capacitor 56 will increase with decreasing frequency because the reactance of capacitor 56 increases with decreasing frequency and since capacitor 56 is in the same feedback loop, capacitor 56 tends to cause operational amplifier 60 to act as an active high-pass filter. These components are chosen so that there is a frequency range at which the negative feedback impedance across operational amplifier 60 is at a maximum; the feedback loop is essentially a high-pass filter and a low-pass filter in parallel. At all other frequencies, the reactance of either capacitor 56 or capacitor 58 will predominate and this negative feedback impedance will decrease below its maximum. Therefore, operational amplifier 60 operates as an active bandpass filter with a maximum output in one frequency band and a lesser output at all other frequencies. Potentiometer 62 permits the bandpass filter response of operational amplifier 60 to be tuned to a center frequency of 216 Hz and a Q of 10. This blocks extraneous harmonics of 216 Hz (and 60 Hz hum from adjoining power sources) from reaching the remaining circuit components, while permitting the 216 Hz AM signal produced at the output of operational amplifier 44 to continue through the system with minimal attenuation.

The output of bandpass filter 160 is connected to the inverting input of operational amplifier 66 by coupling resistor 68. The inverting input and the output of operational amplifiers 66 are connected together by resistor 70, which establishes a negative feedback loop across operational amplifier 66. The non-inverting input of operational amplifier 66 is grounded through resistor 72. Operational amplifier 66 is part of the same chip which which includes operational amplifier 60 and power connections thereto are thus not shown.

Operational amplifier 66 is thus connected as an inverting amplifier, and serves as an inverting buffer which presents a high impedance as viewed from the output of operational amplifier 60. This prevents loading of operational amplifier 60 and a resulting change in the response of bandpass filter 160.

The output of operational amplifier 66 is connected to two further operational amplifiers 74 and 78 which are part of the same semiconductor chip and which form the front end of the full-wave rectifier 170, shown in FIG. 8B. The output of operational amplifier 66 is connected to the inverting input of operational amplifier 74 via coupling resistor 76, and is further connected to the inverting input of operational amplifier 78 via coupling resistor 80.

The anode of diode 81 is connected to the output of operational amplifier 74 and the cathode of diode 81 is connected to the inverting input thereof. One end of resistor 82 is connected to the inverting input of operational amplifier 74, while the other end of resistor 82 is connected to the anode of diode 84. The cathode of diode 84 is connected to the output of operational amplifier 84. The non-inverting input of operational amplifier 74 is coupled to ground by resistor 86. One end of coupling resistor 88 is connected to an end of resistor 82 and to the anode of diode 84, while the other end of resistor 88 is connected to the inverting input of operational amplifier 78.

It will be recalled that an AM signal having a constant carrier frequency of 216 Hz appears at the output of operational amplifier 66. The carrier frequency is modulated in accordance with position of cam 7. When the output of operational amplifier 66 is positive, diode 84 is forward biased and operational amplifier 74 operates as an inverting voltage follower.

Both resistor 80 and resistor 88 are connected to the inverting input of operational amplifier 78. Since resistor 80 is slightly more than twice the resistance of resistor 88, the signal passing through resistor 88 will have double the weight of the signal passing through resistor 80 from operational amplifier 66. Let it be assumed that the voltage at the output of operational amplifier 66 is x. The net effective voltage at the inverting input of operational amplifier 78 will then be $-x$; a $-x$ from the output of operational amplifier 74 having a weight of two will be added to from the output of operational amplifier 66 and $-2x+x=-x$. Thus, on a positive half-cycle from the output of operational amplifier 66, the effective voltage at the inverting input of operational amplifier 78 will have the same magnitude as the voltage at the output of operational amplifier 66, but will have the opposite sign.

On a negative half-cycle from the output of operational amplifier 66, diode 84 will be back-biased and diode 81 will be forward-biased. Since diode 81 bridges across the inverting input and the output of operational amplifier 74, a negative half-cycle output from operational amplifier 66 has the effect of taking operational amplifier 74 completely out of the circuit since its output and inverting input are shunted and it thus has a gain of 0. Thus, the only voltage present at the inverting input of operational amplifier 78 is the negative half-cycle voltage from the output of operational amplifier 66.

Thus, operational amplifier 74 and its associated components, together with resistors 80 and 88, performs the function of a semiconductor diode bridge which is not used in this embodiment. If the AM signal at the output of operational amplifier 66 drops below the $V_{BE}$ of a conventional semiconductor diode, so that, at such low voltages, a semiconductor diode bridge will act as an open circuit. The amplifier 74 supplies the additional energy required to compensate for the diode drop. However, by using higher voltages it would be possible to replace this circuitry with a conventional full-wave rectifier.

Operational amplifier 78 is connected as an inverting active low-pass filter/amplifier. The negative feedback loop associated with operational amplifier 78 has two parallel branches; one branch including electrolytic capacitor 90 and the other branch including resistor 92 and potentiometer 94 placed in series with each other. The active low-pass filter characteristics of operational amplifier 78 are caused by capacitor 90, because as frequency increases, the reactance of capacitor 90 will decrease, negative feedback will increase, and overall gain will drop. Gain of operational amplifier 78 can be adjusted by adjustment of potentiometer 94.

A resistance network is connected to the non-inverting input of operational amplifier 78 in order to compensate for size variations in cam 7. The non-inverting input of operational amplifier 78 is coupled to ground by resistor 96 and is also connected to one end of potentiometer 98. The other end and the tap of potentiometer 98 are connected to one end of resistor 100. The other end of resistor 100 is connected to the anode of diode 102 and to one end of resistor 104. The other end of resistor 104 is connected to the low voltage positive supply, and the cathode of diode 102 is grounded. Since diode 102 is supplied with power through resistor 104, there will always be a small voltage drop of $V_{BE}$ across diode 102. This small voltage is divided in a voltage divider formed by resistors 100 and 96 and potentiometer 98, and the thus-divided voltage is applied to the non-inverting input of operational amplifier 78 as a correction voltage.

If the maximum and minimum diameters of cam 7 vary from their desired values, the intensity of infrared radiation on photodiode 34 may be excessive or insufficient. The excess or insufficiency can be corrected by appropriately adjusting potentiometer 98. Thus, let it be assumed that cam 7 as a whole is slightly oversize. This will have the effect of increasing the amount of light incident upon photodiode 34 and thereby increasing the amplitude of the output of operational amplifier 66. Thus, the voltage at the inverting input of operational amplifier 78 will be excessive. In order to correct for the excess, the correction voltage at the non-inverting input of operational amplifier 78 will be increased by decreasing the resistance of potentiometer 98.

The output of full-wave rectifier 170 (at operational amplifier 78) will thus be a DC signal with a voltage equal to the amplitude of the AM signal at the output of operational amplifier 66. This DC signal is routed to a voltage-to-frequency converter chip 106 through coupling resistor 108 which is connected to pin 7 of voltage-to-frequency converter 106. Voltage-to-frequency converter 106 is the front end of output stage 180. Voltage-to-frequency converter 106 is here identical to voltage-to-frequency converter 2, so that almost all of the components associated with voltage-to-frequency converter 106 perform functions identical to those corresponding components which are associated with voltage-to-frequency converter 2.

In this example, the only difference between the connection of voltage-to-frequency converter 106 and voltage-to-frequency converter 2 resides in the interconnection of pin 8 and pin 3 via resistor 128. Resistor 128 raises the output voltage from pin 3 to an appropriate logic level output signal in digital form. This output signal is placed across a voltage divider formed by resistors 130 and 132; one end of resistor 130 is connected to pin 3 of voltage-to-frequency converter 106 and the other end is connected to ground via resistor 132.

At the common junction point of resistors 130 and 132 there appears an FM output signal in digital form with a frequency which is linearly proportional to the voltage at the output of operational amplifier 78. This digital output signal is routed to a decade counter 134 manufactured by RCA under the designation CD4017 AE. The input to decade counter 134 is at pin 14 and the output therefrom is at pin 12. Every 10 pulses of the output signal from voltage-to-frequency converter 106, a pulse will appear at pin 12 of decade counter 134. This output pulse is routed to the input of a like decade counter 136, which likewise performs another division by 10. Therefore, if the FM signal coming into decade counter 134 is at 1000 Hz, the FM signal from decade counter 136 at line 138 will be frequency divided by a factor of 100, or 10 Hz. This frequency division is preferred, but is not necessary to the practice of the invention.

As mentioned above, potentiometer 50 is first adjusted so that 0 volts appears at the output of operational amplifier 44 when photodiode 34 is completely covered. Next, potentiometer 62 is adjusted to maximize the output at operational amplifier 60. Next, the output of operational amplifier 78 is set to equal exactly one volt and the frequency of the output signal at pin 3 of the analog to digital converter 106 is measured. Potentiometer 126 is then adjusted until the frequency at pin 3 of analog-to-digital converter 106 is 1000 Hz.

After these adjustments are completed, cam 7, fiber optic bundle 1 and block 37 are installed on the utility meter in such a fashion that cam 7 is at a position in which maximum light intensity is incident upon photodiode 34, i.e., cam 7 is at a position indicating a least significant digit of 0. At this point, fiber optic bundle 1 is moved relative to cam 7 until a maximum signal appears at the output of operational amplifier 78. At this point, block 37 is tightened. Next, potentiometer 48 is adjusted so that the desired maximum voltage at the output of operational amplifier 78 is exactly one volt.

Thereafter, cam 7 is rotated 36° at a time and the output from operational amplifier 78 is monitored. In the event that the voltage deviates from the voltage shown in Table 1 as a result of a deviation of cam size from its nominal dimensions, the voltage deviation can be corrected by adjustment of potentiometer 98. It is sufficient if all voltages at the output of operational amplifier 78 are within 5% of the voltages shown in Table 1.

What is claimed is:

1. In an angular position sensor:
   means for mounting a light transmitter in a first fixed position;
   means for mounting a light receiver in a second fixed position; and
   an element mounted for rotation about a fixed axis and having a light reflecting track, the track being so constructed on the element that points along the track progressively define a point of light incidence assuming a predefined sequence of positions as the element is rotated through a single rotation, such that each position in said sequence is at a different distance from at least one of said transmitter and said receiver, light from the transmitter being reflected from the light reflecting track onto the light receiver along an optical path having a path length that assumes unique values as the element rotates through a single rotation, whereby the amplitude of received light is uniquely related to the angular position of said element.

2. The angular position sensor defined by claim 1, wherein the light reflecting track has a matte finish.

3. The angular position sensor defined by claim 2, wherein the matte finish is a layer of flat white paint.

4. The angular position sensor defined by claim 1, wherein the element is a generally disc-like cam with a helical track.

5. The angular position sensor defined by claim 4, wherein the track is on a peripheral edge of the cam.

6. The angular position sensor defined by claim 4, wherein the track has a smooth surface.

7. The angular position sensor defined by claim 4, wherein the track has a stepped surface.

8. The angular position sensor defined by claim 4, wherein the cam is made of a transparent material.

9. The angular position sensor defined by claim 1, further comprising a light transmitter and a light receiver contained within a single unit.

10. The angular position sensor defined by claim 9, wherein the unit comprises a fiber optic bundle.

11. The angular position sensor defined by claim 10, wherein the fiber optic bundle comprises coaxial light transmitting members.

12. The angular position sensor defined by claim 11, wherein the fiber optic bundle comprises a central core fiber and a cylindrical outer layer of optical fibers surrounding the core fiber.

13. The angular position sensor defined by claim 12, wherein the core fiber has a numerical aperture which is less than the numerical aperture of optical fibers in the cylindrical outer layer.

14. The angular position sensor defined by claim 12, further including a light source coupled to the outer layer and a photodetector coupled to the core fiber.

15. An angular position sensor in accordance with claim 1, including a predetermined axis coincident with the fixed axis and further comprising:
    a light transmitter and a light receiver;
    a light source providing light to the transmitter; and
    photodetector means for receiving light from the light receiver and producing an electrical signal varying in accordance with intensity of the light received by the photodetector means.

16. The angular position encoding system defined by claim 15, further means for interrupting light provided by the light source at a fixed frequency, whereby the electrical signal is at the fixed frequency and is amplitude-modulated in accordance with intensity of light received by the photodetector means.

17. The angular position encoding system defined by claim 16, further comprising output stage means for producing an electrical output signal, in digital form, representing the amplitude of the amplitude-modulated signal.

18. The angular position encoding system defined by claim 17, further comprising means coupled to the photodetector means for full-wave rectifying the amplitude-modulated signal, the means for full-wave rectifying driving said output stage means.

19. The angular position encoding system defined by claim 18, wherein the means for full-wave rectifying comprises an active full-wave rectifier.

20. The angular position encoding system defined by claim 19, wherein the means for full-wave rectifying comprises an active low-pass filter/amplifier.

21. The angular position encoding system defined by claim 18, wherein said output stage means further comprises frequency modulator means for producing a digital signal having a frequency which varies with the signal from the means for full-wave rectifying.

22. The angular position encoding system defined by claim 21, wherein said output stage means further comprises a frequency divider which is driven by said digital signal.

23. The angular position encoding system defined by claim 16, further comprising a bandpass filter tuned to the fixed frequency, the bandpass filter being coupled to receive the amplitude-modulated signal.

24. The angular position encoding system defined by claim 16, wherein said fixed frequency is non-integral multiple of 60 Hz.

25. In an apparatus for use with a utility meter which has a plurality of rotating shafts that rotate in accordance with consumption, an angular position sensor for one of said shafts, comprising:
    means for mounting a light transmitter in a first fixed position;
    means for mounting a light receiver in a second fixed position;
    an element mounted on said one of the shafts for rotation therewith and having a light reflecting track, the track being so positioned on the element that positions along the track progressively define a point of light incidence assuming a predefined sequence of positions as the element is rotated through a single rotation, such that each position in said sequence is at a different distance from at least one of said transmitter and said receiver, light from the light transmitter being reflected from the light reflecting track onto the receiver along an optical path having a path length that assumes unique values as the element rotates through a single rotation, whereby the amplitude of received light is uniquely related to the angular position of said element.

26. The apparatus defined by claim 25, wherein said one shaft has an angular rotation which is associated with a least significant digit in a consumption reading.

27. The apparatus defined by claim 25, wherein the element is a transparent cam having a light reflecting track on a peripheral surface, and wherein said least significant digit is viewable through the element.

28. The apparatus defined by claim 27 wherein the light reflecting track has a matte finish.

29. The apparatus defined by claim 28, wherein the light reflecting track has a smooth surface.

30. The apparatus defined by claim 26, further comprising a light transmitter, a light source providing light to the transmitter, photodetector means for receiving light from the light receiver and producing an electrical signal varying in accordance with intensity of the light received by the photodetector means and means coupled to the photodetector means for utilizing variation of said electrical signal to produce an output signal which represents the magnitude of the digit.

31. The apparatus defined by claim 30, wherein the light source and the photodetector means respectively emit and respond to infrared radiation.

* * * * *